(12) United States Patent
Preti et al.

(10) Patent No.: US 12,325,932 B2
(45) Date of Patent: Jun. 10, 2025

(54) METHOD FOR CVD DEPOSITION OF n-TYPE DOPED SILICON CARBIDE AND EPITAXIAL REACTOR

(71) Applicant: LPE S.p.A., Baranzate (IT)

(72) Inventors: Silvio Preti, Baranzate (IT); Gianluca Cividini, Baranzate (IT)

(73) Assignee: LPE S.p.A., Baranzate (IT)

( * ) Notice: Subject to any disclaimer, the term of this patent is extended or adjusted under 35 U.S.C. 154(b) by 163 days.

(21) Appl. No.: 18/024,539

(22) PCT Filed: Sep. 9, 2021

(86) PCT No.: PCT/IB2021/058194
§ 371 (c)(1),
(2) Date: Mar. 3, 2023

(87) PCT Pub. No.: WO2022/053963
PCT Pub. Date: Mar. 17, 2022

(65) Prior Publication Data
US 2023/0313410 A1 Oct. 5, 2023

(30) Foreign Application Priority Data
Sep. 11, 2020 (IT) .................. 102020000021517

(51) Int. Cl.
*C30B 25/08* (2006.01)
*C23C 16/32* (2006.01)
(Continued)

(52) U.S. Cl.
CPC ............ *C30B 25/14* (2013.01); *C23C 16/325* (2013.01); *C23C 16/45502* (2013.01);
(Continued)

(58) Field of Classification Search
CPC ....... C30B 25/14; C30B 25/08; C30B 25/183; C30B 25/12; C30B 29/36; C23C 16/325;
(Continued)

(56) References Cited

U.S. PATENT DOCUMENTS

| 2016/0348274 A1* | 12/2016 | Genba | ..................... C30B 25/10 |
| 2017/0345658 A1 | 11/2017 | Fukada | |
| 2020/0043725 A1 | 2/2020 | Wada | |

FOREIGN PATENT DOCUMENTS

| WO | 2004053187 A1 | 6/2004 |
| WO | 2004053188 A1 | 6/2004 |

(Continued)

*Primary Examiner* — Robert M Kunemund
(74) *Attorney, Agent, or Firm* — Dickinson Wright PLLC; Andrew D. Doriio

(57) ABSTRACT

The method serves for depositing a layer of silicon carbide with n-type doping onto a surface of a substrate placed horizontally on a rotating susceptor inside a reaction chamber by means of a CVD type process; the rotating susceptor is adapted to single-substrate support; the method includes introducing and flowing a gaseous mixture internally along the reaction chamber from a first side to a second side passing over a portion of a lower wall of said reaction chamber and then over said rotating susceptor supporting one substrate; the gaseous mixture comprises or consists of: one or more gases being precursor of silicon carbide to be deposited and a carrier gas and a precursor gas containing a substance adapted to give rise to n-type doping; the dopant substance is adapted to be subjected to pyrolysis catalysed by contact with an internal surface made of silicon carbide of said reaction chamber forming species with stoichiometry $NH_xC_yS_{iz}$ where x and y and z are comprised between 0 and 3 and $x+y+z>0$, the reaction chamber is at a temperature comprised in the range between 1450° C. and 1800° C. and at a pressure comprised in the range between 5 kPa and 30 kPa; the substrate is placed inside the reaction chamber in a
(Continued)

Figure 1:
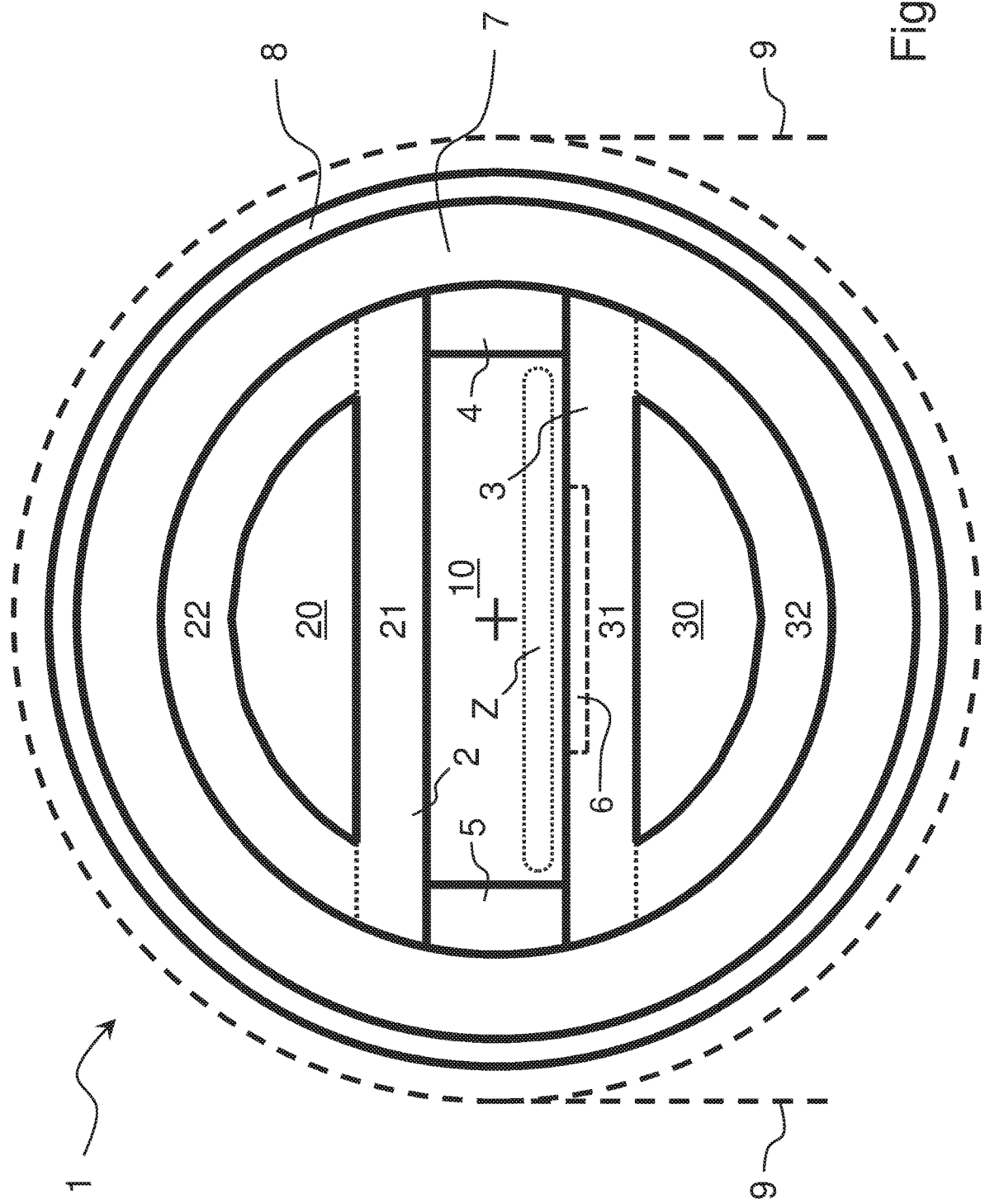

region where trends in availability respectively of Si, C and N are all decreasing and where temperature is within a deposition temperature range.

20 Claims, 5 Drawing Sheets

(51) Int. Cl.
- C23C 16/455 (2006.01)
- C23C 16/458 (2006.01)
- C30B 25/12 (2006.01)
- C30B 25/14 (2006.01)
- C30B 25/18 (2006.01)
- C30B 29/36 (2006.01)
- H01L 21/02 (2006.01)

(52) U.S. Cl.
CPC .......... *C23C 16/4584* (2013.01); *C30B 25/08* (2013.01); *C30B 25/12* (2013.01); *C30B 25/183* (2013.01); *C30B 29/36* (2013.01); *H01L 21/02447* (2013.01); *H01L 21/02529* (2013.01); *H01L 21/02576* (2013.01); *H01L 21/0262* (2013.01)

(58) Field of Classification Search
CPC .......... C23C 16/45502; C23C 16/4584; H01L 21/262; H01L 21/02576; H01L 21/2529; H01L 21/02447
See application file for complete search history.

(56) References Cited

FOREIGN PATENT DOCUMENTS

| | | | |
|---|---|---|---|
| WO | 2007088420 | A2 | 8/2007 |
| WO | 2008011022 | A1 | 1/2008 |
| WO | 2015092525 | A1 | 6/2015 |
| WO | 2020128653 | A1 | 6/2020 |

* cited by examiner

METHOD FOR CVD DEPOSITION OF n-TYPE DOPED SILICON CARBIDE AND EPITAXIAL REACTOR

FIELD OF THE INVENTION

The present invention relates to a method for depositing a layer of silicon carbide with n-type doping on a substrate of silicon carbide by means of a CVD type process at high temperature as well as an epitaxial reactor.

STATE OF THE ART

In some known epitaxial reactors for deposition of silicon carbide onto substrates, n-type doping is often obtained by adding gaseous nitrogen, i.e. N2, to the gaseous mixture introduced into the reaction chamber. This is disclosed in general for example in WO2008011022A1.

The n-type doping uniformity of a layer obtained in this way is not particularly high. In other known epitaxial reactors for deposition of silicon carbide onto substrates, n-type doping is often obtained by adding gaseous ammonia, i.e. NH3, to the gaseous mixture introduced into the reaction chamber. This is disclosed for example in US2017345658A1 (read e.g. claim 4) in connection to a reaction chamber having a "shower-head" architecture and wherein the gas inlets are above the substrate and appropriately spaced therefrom, and wherein the various precursor gasses are mixed inside the reaction chamber at high temperature.

It should be noted that the architecture of the reaction chamber, in particular the configuration thereof, affects the doping uniformity.

SUMMARY

The general object of the present invention is to improve the n-type doping uniformity of a silicon carbide layer obtained by means of a CVD type process at high temperature carried out through an epitaxial reactor comprising a reaction chamber and a rotating susceptor inside it, wherein a gaseous mixture flows internally along the reaction chamber from a first side to a second side passing over the rotating susceptor supporting one substrate.

This object is achieved thanks to the method having the technical features set out in the annexed claims which are to be considered an integral part of the present description.

A first important idea underlying the present invention is to use, as a precursor for n-type doping, a dopant substance adapted to be subjected to pyrolysis catalysed by contact with an internal surface of the reaction chamber, forming species with stoichiometry $NH_xC_yS_iz$, where x and y and z are comprised between 0 and 3 and $x+y+z>0$, making nitrogen readily available for incorporation into silicon carbide. Instead, gaseous nitrogen requires considerable energy to make nitrogen available in atomic form; as it is clear to the person skilled in the art nitrogen, i.e. N2, cannot form species with the above defined stoichiometry.

A second important idea underlying the present invention is to place a substrate inside the reaction chamber in a region where trends in availability respectively of Si, C and N are all decreasing and where temperature is within a deposition temperature (narrow) range.

According to the present invention, the reactor is of the "single-wafer" type. i.e. there is only one substrate on the rotating susceptor inside the reaction chamber during a deposition process.

Figure 3:
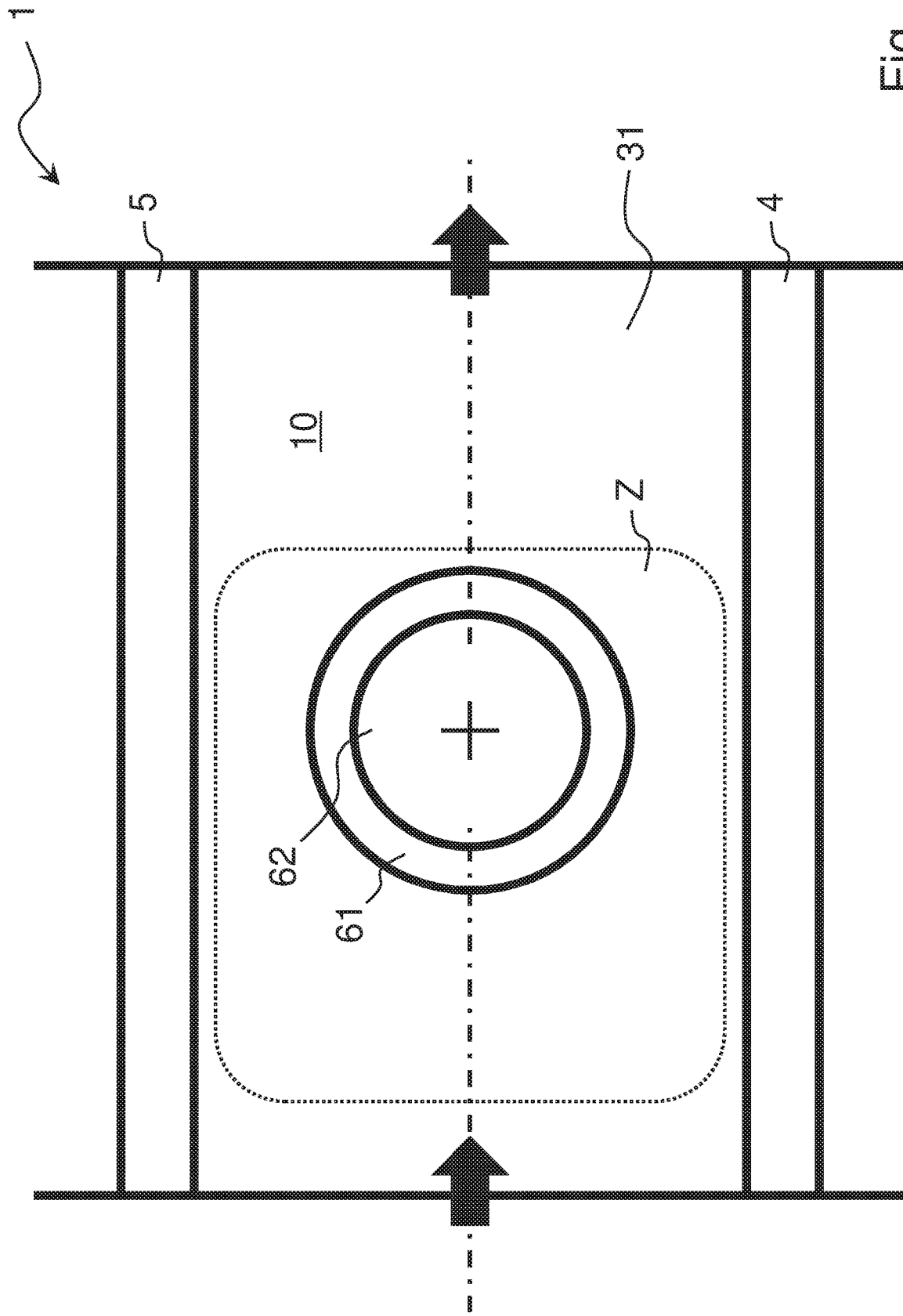

US2020043725A1 discloses a "multi-wafer" reactor having a reaction chamber with the above architecture; according to the embodiment of FIG. 3 three substates are stably supported by the rotating susceptor and according to the embodiment of FIG. 13 three substates are rotatably supported by the rotating susceptor.

The general teaching of US2020043725A1 is to obtain doping from a mixture of ammonia and nitrogen (read abstract, paragraphs [0004] and [0023], claims 1 and 3); indeed, the flow of ammonia is much smaller than the flow of nitrogen, i.e. a ratio of less than 0.0089.

According to the experiments described in this patent document, using only ammonia as doping substance led to a doping uniformity of 26% (see FIG. 6), using only nitrogen as doping substance led to a doping uniformity of 22% (see FIG. 5), using a mixture of ammonia and nitrogen with a ratio of 0.022/7.8=0.0028 led to a doping uniformity of 20% (see FIG. 7).

Therefore, undoubtedly, US2020043725A1 provides also the general teaching to avoid the use of pure ammonia as a doping substance.

In any case, this patent document does not provide scientific reasons behind the three experiments and their different doping uniformity.

The Applicant has found out how to use only ammonia (or a similar gas) as doping gas by leveraging on the reaction chamber architecture with huge advantage on the resulting doping uniformity.

Typically, the present invention applies to a reaction chamber with "hot walls" (heated by induction) made of silicon carbide, or better graphite coated with silicon carbide, having longitudinal flow of the gases inside the chamber.

Typically, according to the present invention, the cross-section of the reaction chamber has a rectangular shape; the rectangle may have a width much greater than the height, in particular 5-20 times greater and more particularly about 10 times greater.

Typically, according to the present invention, the width of the reaction chamber (corresponding approximately to the width of the above mentioned rectangle) is greater than the diameter of a substrates support element, in particular 10-30% greater and more particularly about 20% greater.

Typically, according to the present invention, the length of the reaction chamber is greater than the diameter of a substrates support element, in particular 60-120% greater and more particularly about 80% greater.

Typically, according to the present invention, the distance between the initial point of the reaction chamber and the initial point of the substrates support element (along the axis of the reaction chamber) is L times the diameter of the substrates support element and/or is M times the width of the reaction chamber and/or N times the height of the reaction chamber; in particular. L is 0.3-0-5 and more particularly is about 0.4 and M is 0.25-0.45 and more particularly is about 0.35 and N is 2.5-4.5 and more particularly is about 3.5.

Typically, according to the present invention, the substrates are supported by a substrate support element (preferably completely or partially removable) which rotates during a deposition process; the substrate support element is placed on a rotating susceptor.

According to a further aspect, the present invention relates to an epitaxial reactor.

LIST OF FIGURES

Figure 2:
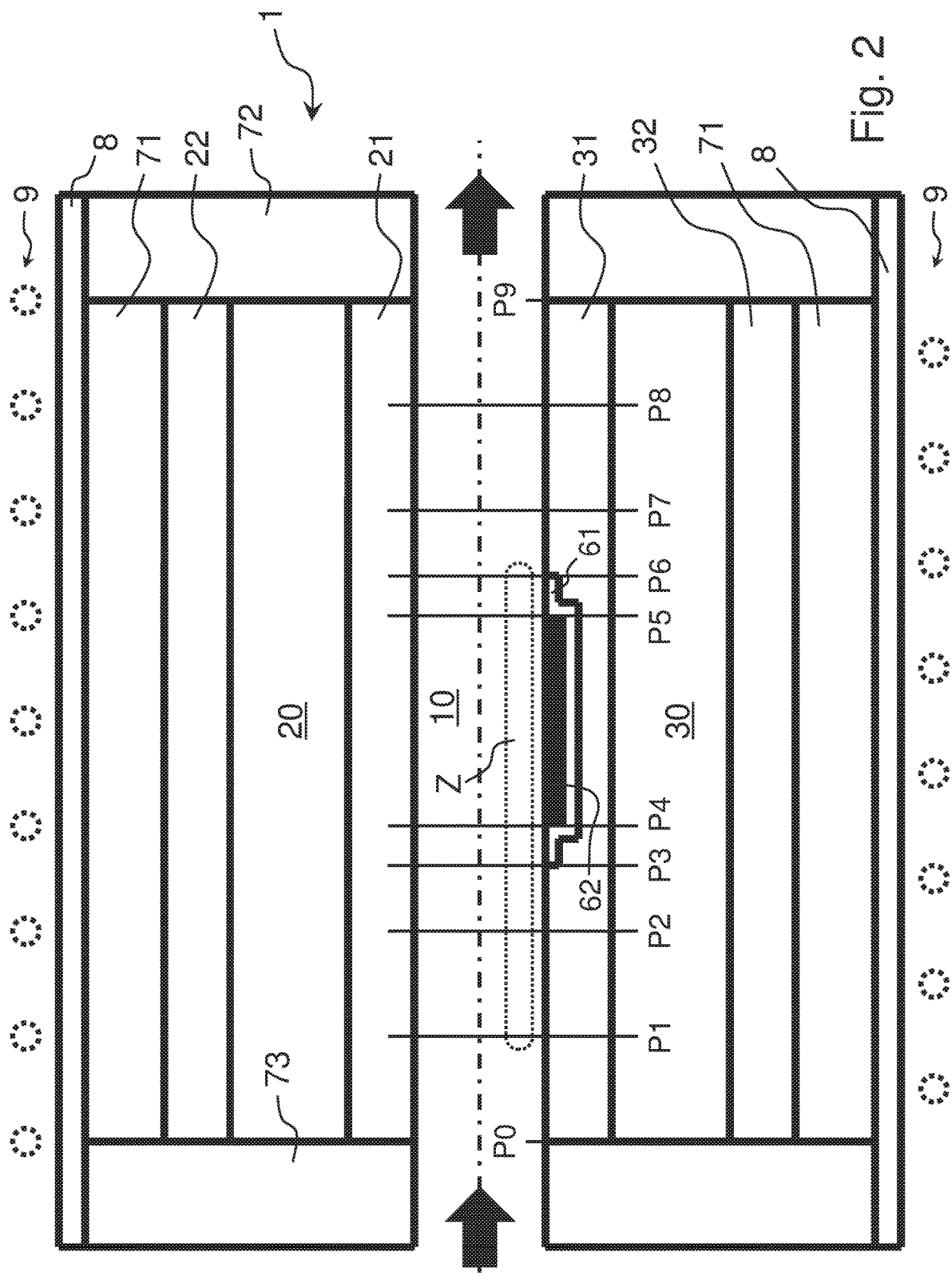
Figure 4:
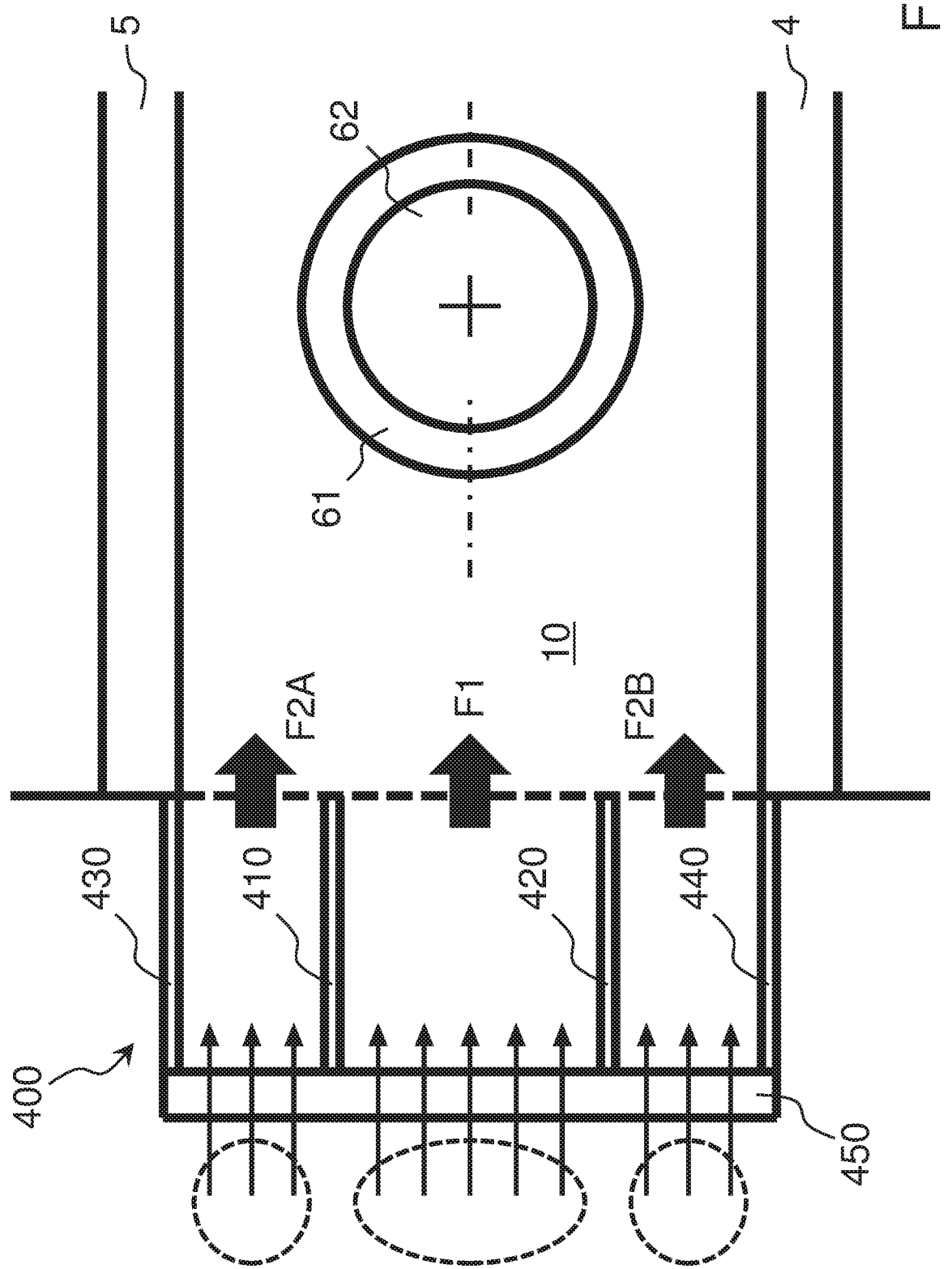
Figure 5:
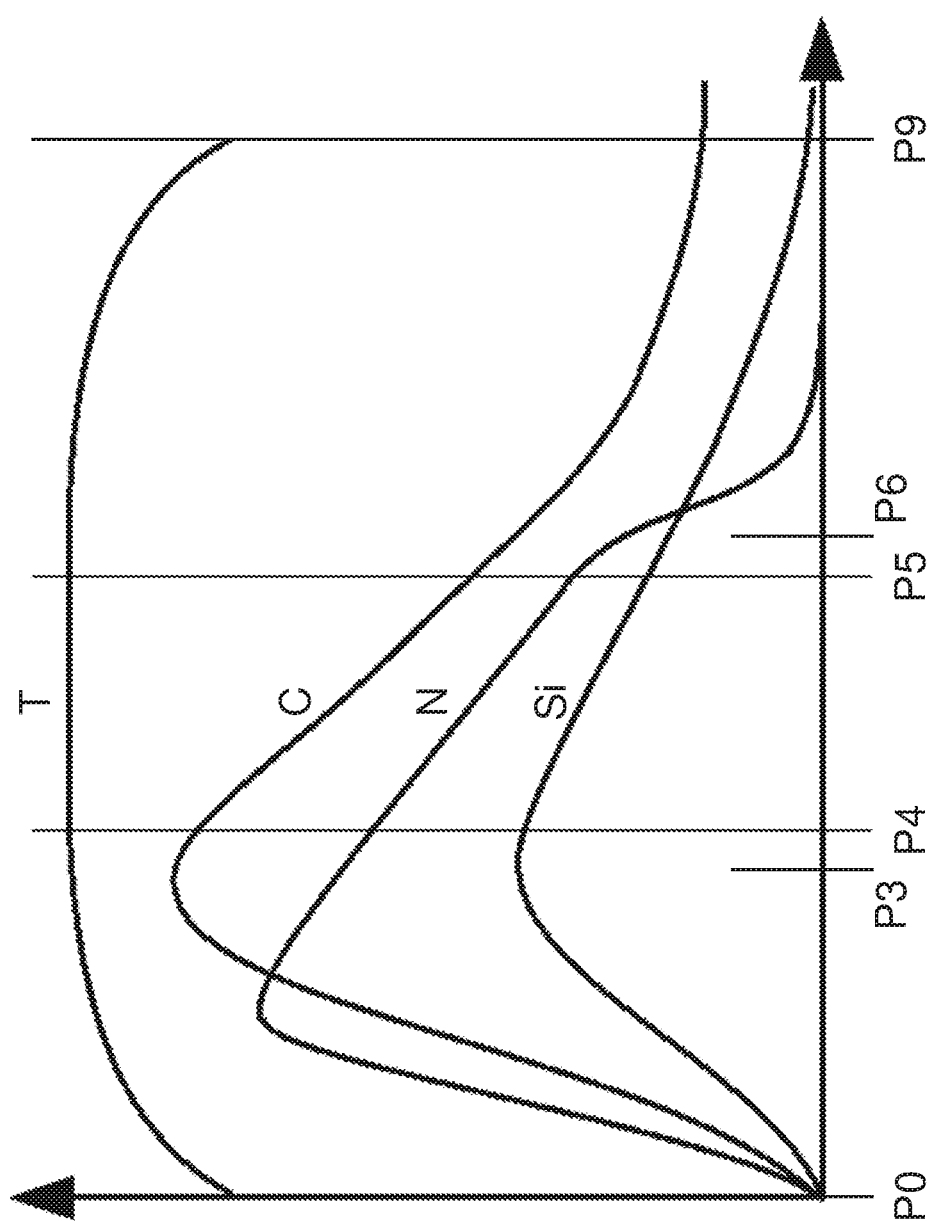

The present invention shall become more readily apparent from the detailed description that follows to be considered together with the accompanying drawings in which:

FIG. 1 shows a schematic cross-sectional view of an epitaxial reactor reaction chamber of the Applicant suitable for implementing the method according to the present invention, FIG. 2 shows a schematic view in longitudinal section of the reaction chamber of FIG. 1, FIG. 3 shows a schematic (partial) top view of the reaction chamber of FIG. 1 with a substrate inside, FIG. 4 shows a schematic (partial) top view of the reaction chamber of FIG. 3 preceded by an innovative assembly for introducing gaseous mixtures into the chamber, and FIG. 5 shows approximate plots (not in the same scale) of the availabilities of Si. C and N as well as the temperature inside an embodiment of a reaction chamber according to the present invention when an embodiment of a deposition method according to the present invention is carried out.

As can be easily understood, there are various ways of practically implementing the present invention which is defined in its main advantageous aspects in the annexed claims and is not limited either to the following detailed description or to the annexed claims.

DETAILED DESCRIPTION

In the figures from FIG. 1 to FIG. 3 an embodiment of a reaction chamber 1 of an epitaxial reactor is shown.

The reaction chamber 1 has technical characteristics similar to those shown and described in the international patent applications WO2004053187, WO2004053188, WO2007088420 and WO2015092525 (which are incorporated herein by reference).

The reaction chamber 1 extends uniformly along a longitudinal direction. It comprises a susceptor assembly comprising four susceptor elements 2, 3, 4 and 5 that define a reaction and deposition zone 10 and that are contained in a casing 7 made of heat insulating material; the casing 7 is inserted in a quartz tube 8 that may be hollow and cooled through an internal liquid flow. The casing 7 comprises a tube 71 and two circular caps 72 and 73. An inductor 9 is wound around the tube 8 and is adapted to heat the elements 2, 3, 4 and 5 by electromagnetic induction being appropriately driven by an electric power generator; the inductor 9 is shown with a dashed line because, strictly speaking, it is not part of reaction chamber 1. The elements 4 and 5 are two laths and constitute the lateral walls of the zone 10. The elements 2 and 3 are two projection solids with a circular segment shaped section and with a through hole 20 and 30 having a circular segment shaped section; therefore, they are comprised of a flat plate 21 and 31 and a curved plate 22 and 32; the flat plates 21 and 31 constitute respectively the upper and lower walls of the zone 10. The elements 2, 3, 4 and 5 which are made of graphite and coated with silicon carbide (and/or tantalum carbide) at least on their surfaces facing the zone 10. The lower wall 31 is adapted to house an assembly 6 that comprises, among other things, a support element 61 (typically rotating during the deposition processes) adapted to support one substrate 62 subject to deposition; according to this embodiment, the support element 61 can be inserted and extracted from the zone 10. The two caps 72 and 73 have openings, in particular an opening in the cap 73 for the entry of a gaseous mixture with precursor gases (see the black arrow on the left) and an opening in the cap 72 for the exit of exhaust gases (see the black arrow on the right).

The reaction chamber of FIG. 1 can be the subject of many variants. For example, the elements 4 and 5 could be made entirely of electrical insulating material, in particular silicon carbide and/or tantalum carbide; in this case, it is more correct to call them "separator elements".

In FIG. 2 a series of planes at successive longitudinal positions P0, P1, P2, P3, P4, P5, P6, P7, P8 and P9 are highlighted, being successive in the direction of the flow of the gaseous mixture in the zone 10 of the chamber. In particular, P0 is at the beginning of the zone 10 (real start of the reaction chamber), P1 is just after the beginning of the zone 10, P2 is advanced with respect to the beginning of the zone 10. P3 is at the beginning of the support element, P4 is at the beginning of the substrate, P5 is at the end of the substrate. P6 is at the end of the support element, P7 is set back with respect to the end of the zone 10, P8 and just before the end of the zone 10, P9 is at the end of the zone 10 (real end of the reaction chamber). It can be thought that the planes P1-P8 represent, with a certain simplification, the front of the gaseous mixture that progressively advances in the zone 10.

As previously stated, the present invention considers pyrolysis of substances catalysed by contact with internal surfaces of the reaction chamber. In the figures from FIG. 1 to FIG. 3, a zone Z affected by this phenomenon and particularly relevant for the purposes of the present invention is highlighted because it has a greater influence on the doping of a layer deposited onto the substrate 62; the zone Z is located above the upper surface of the flat plate 31 of the lower wall 3, and extends laterally between the walls 4 and 5, and longitudinally approximately from the plane P1 to approximately the plane P6—before the plane P1 the gases are still quite cold; it is clear that the representation of the zone Z is only indicative.

The method according to the present invention serves for depositing a layer silicon carbide with n-type doping onto a surface of a substrate, in particular made of silicon carbide, placed horizontally on a rotating susceptor (not shown in FIGS. 1-4 for the sake of simplicity—may be part of assembly 6 and located under support element 61 according to the embodiment FIG. 1 and FIG. 2) inside a reaction chamber by means of a CVD type process at high temperature; according to the embodiments of FIGS. 1-4, the deposition can take place onto only one substrate at a time.

The method includes introducing and flowing a gaseous mixture internally along the reaction chamber at high temperature from a first side to a second side passing over a portion of a lower wall of said reaction chamber and then over said rotating susceptor supporting one substrate; the gaseous mixture comprises or consists of: one or more gases being precursor of silicon carbide to be deposited and a carrier gas and possibly a precursor gas containing a substance adapted to give rise to n-type doping. The arrows in FIG. 2 and FIG. 3 schematically show the flow of this gaseous mixture entering and exiting the reaction chamber, in particular the reaction and deposition zone, in particular at its ends. Typically, the precursor gases are not fully exploited. i.e. a considerable percentage of these gases leave the chamber not exhausted. It is to be noted that, for the dopant substance according to the present invention (in particular in the case of ammonia), as its molecule breaks down "easily", the percentage of non-exhausted gas leaving the chamber may be low or null.

The "substance" or "dopant substance" is adapted to be subjected to pyrolysis catalysed by contact with an internal surface of the reaction chamber, forming species with stoichiometry $NH_xC_yS_{iz}$ where x and y and z are comprised between 0 and 3 and $x+y+z>0$. In the embodiment of the figures, the internal surface of particular interest for the purposes of the present invention is the upper surface of the flat plate 31 of the lower wall 3, i.e. the one where the substrate 62 is located, and is made of silicon carbide. In the embodiment of the figures, the zone of particular interest for the purposes of the present invention is the zone Z where the above pyrolysis takes place—it should be noted that the above pyrolysis also takes place elsewhere.

Typically, the chamber is at a temperature comprised in the range between 1450° C. and 1800° C. and at a pressure comprised in the range between 5 kPa and 30 kPa; depending on the specific deposition process to be carried out, the effective deposition temperature range and the effective deposition pressure range are much narrower.

Species with the above stoichiometry make nitrogen readily available for incorporation into silicon carbide.

According to the present invention, the substrate is placed inside the reaction chamber in a region (for example from P4 to P5 in FIG. 5) where trends in availability respectively of Si, C and N are all decreasing (preferably in a similar way as shown in FIG. 5 where all are shown as e.g. approximately linearly decreasing) and where temperature is within a deposition temperature range. Availabilities of Si, C and N should preferably be higher than respective predetermined thresholds so to guarantee the creation of the layer.

FIG. 5 shows approximate plots of the availabilities of Si, C and N as well as the temperature inside an embodiment of a reaction chamber according to the present invention when an embodiment of a deposition method according to the present invention is carried out; the x-coordinate corresponds to the longitudinal position inside the reaction chamber (for example from P0 to P9 in FIG. 5); the plotted values may be considered to correspond to positions along the central longitudinal axis of the reaction chamber (see e.g. FIG. 3) just above the upper surface of the lower wall of the reaction chamber (see e.g. element 31 in FIG. 2). These plots may be obtained either by simulation carried out on a faithful model of a real reactor or by experiments carried out on a real reactor or by combination of simulation and experiments.

FIG. 5 indicates a position range (from P4 to P5 or from a bit before P4, e.g. P3, to a bit after P5, e.g. P6) satisfying the above mentioned position condition. The whole substrate (and the rotating susceptor and possibly the support element) should be placed preferably within this position range. Typically and advantageously, the diameter of the substrate (and the diameter of the rotating susceptor and possibly the diameter of the support element) is selected so to that it is smaller than the width of the position range.

As can be seen in all the figures, gasses are introduced into the reaction chamber only at a first side thereof (see e.g. the arrow on the left in FIG. 2 and FIG. 3).

According to preferred embodiments of the present invention, the dopant substance which is introduced into the chamber is adapted to be subjected to catalysed pyrolysis forming mainly HSiN and HCN; even more preferably, the introduced substance is such as to form mainly HSiN.

The silicon precursor gas (of the silicon carbide to be deposited) is preferably a chlorinated compound, in particular dichlorosilane or trichlorosilane or tetrachlorosilane.

The carbon precursor gas (of the silicon carbide to be deposited) is preferably a hydrocarbon, in particular propane or ethylene or acetylene or methane.

The substance, i.e. the precursor gas of the n type doping, is preferably ammonia (NH3) or acetonitrile (C2H3N) or pyrrole (C4H5N) or hydrazine (N2H4) or hydrogen cyanide (HCN) or methylamine (CH3NH2). According to the experiments of the Applicant, a highly advantageous n-type dopant substance for silicon carbide is ammonia.

According to the experiments of the Applicant, only one n-type dopant substance for silicon carbide may be used, preferably only ammonia.

The carrier gas is preferably hydrogen, helium or argon or mixtures thereof.

The gaseous mixture, when introduced into the reaction chamber, preferably has a C/Si ratio lower than 1.5 and higher than 1.0, in particular about 1.3, so as to form an active layer, and lower than 1.0 and greater than 0.5, in particular about 0.8, so as to form a buffer layer. It should be noted that the dopant substance has practically no effect on the C/Si ratio since its quantity is very small compared to the precursor gases of the silicon carbide.

In order to obtain a good doping uniformity, it is preferable that all the precursor gases behave in a similar way in the reaction chamber, namely in the reaction and deposition zone. In particular, the preferred choice according to the present invention is to select all precursor gases so that they are subjected to a sufficient level of pyrolysis after being introduced into the reaction chamber (e.g. after P1) and before reaching the substrate (e.g. before P3); after reaching the substrate (e.g. after P4), trends in availability of Si, C and N are all decreasing in a similar way (see e.g. the plots in FIG. 5).

To this end, all the substances contained in the precursor gases are adapted to be subjected to pyrolysis catalysed by contact with an internal surface of the reaction chamber, and all the pyrolysis proceeds along the reaction chamber forming species Si and C and N (i.e. the species adapted to be deposited) at least with a constant N/Si ratio. The C/Si. N/Si and N/C ratios must be considered at the same position in the chamber, for example, with reference to the figures, at the planes P1-P8 in particular in the zone Z. In this context, a ratio is considered to be "constant" if the variations thereof are, for example, lower than 30%; this variation may derive from trends in the availability, for example, of N and Si that are identical but similar, i.e. both decreasing.

The result of having constant ratios in all positions of the substrate (for example from P4 to P5) is that the availability of N is higher in the region where the silicon carbide growth rate (determined by the availabilities of Si and C) is higher and is lower in the region where the silicon carbide growth rate is lower, thus providing the same density of N atoms per unit of silicon carbide crystal volume all over the substrate surface.

Evidently, doping uniformity further improves a lot if the substrate is kept in rotation inside the reaction chamber during deposition. Considering for example the plots in FIG. 5, in case of rotation, each of the surface points of a single rotating substrate is periodically subject to a variable availability of N, but 1) what matters is the average and 2) what matters is the ration between availabilities; therefore, a very good result is achieved; for example, according to tests carried out by the Applicant based on the solution according to the present invention, uniformities of 4-6% in the doped layer deposited on 6-inches silicon carbide substrates have recently been achieved using only ammonia as a dopant substance while uniformities of 12-18% were previously achieved using only N2 as dopant substance.

In general, it may be useful to introduce and flow at least one first gaseous mixture and a second gaseous mixture internally along the reaction chamber at high temperature; the first gaseous mixture and the second gaseous mixture comprise or consist of: one or more gases being precursor of silicon carbide and a carrier gas and possibly a precursor gas containing a substance adapted to give rise to n-type doping—the dopant substance is present when a doped deposited layer is desired.

The first gaseous mixture and the second gaseous mixture can be different from each other at least in composition. In particular, to optimize doping uniformity, the difference can be expected only in the quantity of dopant substance.

The introduction flow rate and/or the introduction speed of the first gaseous mixture and the introduction flow rate and/or the introduction speed of the second gaseous mixture may be different from each other.

According to preferred embodiments of the present invention (see for example FIG. 4):
the first gaseous mixture is introduced into a central zone of the reaction chamber (see arrow F1 in FIG. 4), and
the second gaseous mixture is introduced into at least one lateral zone of the reaction chamber (see arrows F2A and F2B in FIG. 4 which indicate the use of the second gaseous mixture on both lateral zones).

An epitaxial reactor for deposition of silicon carbide on substrates by means of CVD type processes at high temperature according to the present invention is adapted to carry out method as described and claimed herein.

Its rotating susceptor is located inside the reaction chamber in a region where trends in availability respectively of Si, C and N are all decreasing and where temperature is within a deposition temperature range—see e.g. FIG. 5.

Advantageously, the rotating susceptor is adapted for single-substrate support.

Advantageously, the epitaxial reactor comprises an assembly for introducing gasses into the reaction chamber in a controlled manner, for this purpose one or more MFC (=Mass Flow Controller) may be used. Typically and advantageously, the assembly is placed before said reaction chamber, wherein said assembly is configured so that gasses are introduced into the reaction chamber only at a first side of said reaction chamber.

Typically, the present invention applies to a reaction chamber with "hot walls" (heated by induction) made of silicon carbide, or better graphite coated with silicon carbide, having longitudinal flow of the gases inside the chamber.

Typically, according to the present invention, the substrates are supported by a substrate support element (preferably completely or partially removable) which rotates during a deposition process; the substrate support element is placed on a rotating susceptor.

Typically, according to the present invention, the cross-section of the reaction chamber has a rectangular shape; the rectangle may have a width much greater than the height, in particular 5-20 times greater and more particularly about 10 times greater.

Typically, according to the present invention, the width of the reaction chamber (corresponding approximately to the width of the above mentioned rectangle) is greater than the diameter of a substrates support element, in particular 10-30% greater and more particularly about 20% greater.

Typically, according to the present invention, the length of the reaction chamber is greater than the diameter of a substrates support element, in particular 60-120% greater and more particularly about 80% greater.

Typically, according to the present invention, the distance between the initial point of the reaction chamber and the initial point of the substrates support element (along the axis of the reaction chamber) is L times the diameter of the substrates support element and/or is M times the width of the reaction chamber and/or N times the height of the reaction chamber, in particular, L is 0.3-0.5 and more particularly is about 0.4 and M is 0.25-0.35 and more particularly is about 0.35 and N is 2.5-4.5 and more particularly is about 3.5.

It is to be noted that FIGS. 1-4 are not in-scale drawings; in particular, in FIG. 3 and FIG. 4, the diameter of the substrate is much smaller that the distance between the lateral walls of the reaction and deposition zone; however, according to some preferred embodiments the diameter is only 15-30% smaller than the distance.

In the embodiment of FIG. 4, the reaction chamber (in particular the reaction and deposition zone) is preceded by an assembly for introducing gaseous mixtures into the chamber. Typically and advantageously, the assembly 400 is adapted to be placed before the reaction chamber of FIG. 1-3 (or similar). Advantageously, it comprises two partitions 410 and 420 which define (together with other walls 430 and 440) three small chambers adapted to guide the flows of the first gaseous mixture (centrally) and of the second gaseous mixture (on both sides respectively); according to some preferred embodiments, the distance between walls 410 and 420 is 2-4 times greater than the distance between walls 430 and 410 and the distance between walls 420 and 440. More particularly, the partitions may be fixed to a plate 450 which preferably has a plurality of holes (see the small arrows crossing the plate).

FIG. 4 highlights that each of the three small chambers is fluidically connected to a "source" of gaseous mixture (in other words, mixing of the gasses occurs preferably before plate 450 in particular at a temperature lower, preferably much lower, than the temperature inside the reaction and deposition zone); conceptually, the three "sources" are independent of each other, typically, the two small lateral chambers have identical size and are fed by the same source.

The "partitioned" gas introducing assembly is arranged so that the gaseous mixtures do not substantially mix before reaching the substrate.

According to advantageous embodiments not shown in any figure, there is a "transition piece" positioned between a gaseous mixture or mixtures introducing assembly and the reaction chamber wherein the gaseous mixture or mixtures flows or flow before entering the reaction chamber (in particular the reaction and deposition zone). Such "transition piece" is used for pre-heating the gaseous mixture or mixtures. Preferably, such "transition piece" is made of graphite (possibly with silicon carbide and/or tantalum carbide coating) and the heating inductor is adapted to heat also such "transition piece" and thus starts (a bit) before the reaction chamber (e.g. a bit more on left than the inductor in FIG. 2).

Preferably, the reaction chamber according to the present invention is kept isolated from the external environment before, during and after deposition by using a load-lock chamber and an automatic loading and unloading system of the substrates, thus avoiding the need to purge the chamber at each deposition.

The invention claimed is:
1. Method for depositing a layer of silicon carbide with n-type doping onto a surface of a substrate placed horizontally on a rotating susceptor inside a reaction chamber by means of a CVD type process, the rotating susceptor being adapted for single-substrate support;
wherein the method includes introducing and flowing a gaseous mixture internally along the reaction chamber from a first side to a second side passing over a portion of a lower wall of said reaction chamber and then over said rotating susceptor supporting one substrate,
wherein the gaseous mixture comprises:
one or more gases being precursor of silicon carbide to be deposited,
a carrier gas, and
a precursor gas containing a substance adapted to give rise to n-type doping;
wherein said substance is adapted to be subjected to pyrolysis catalysed by contact with an internal surface of said reaction chamber forming species with stoichiometry $NH_xC_yS_{iz}$ where x and y and z are comprised between 0 and 3 and x+y+z>0, said internal surface of the reaction chamber comprising walls adapted to be heated by induction which are made of silicon carbide or silicon carbide-coated graphite;
wherein said reaction chamber is at a temperature comprised in the range between 1450° C. and 1800° C. and at a pressure comprised in the range between 5 kPa and 30 kPa;
wherein said substrate is placed inside the reaction chamber in a region having a first longitudinal position and a second longitudinal position, wherein the availability respectively of Si, C and N decreases as the gaseous mixture travels from the first longitudinal position to the second longitudinal position.

2. Method according to claim 1, wherein said substance is adapted to be subjected to pyrolysis catalysed by contact with an internal surface of said reaction chamber, forming mainly HSiN and HCN, wherein HSiN is predominant.

3. Method according to claim 1, which includes introducing and flowing a silicon precursor gas of the silicon carbide to be deposited along the reaction chamber at high temperature, said silicon precursor gas being a chlorinated compound, in particular dichlorosilane or trichlorosilane or tetrachlorosilane.

4. Method according to claim 1, which includes introducing and flowing a carbon precursor gas of the silicon carbide to be deposited along the reaction chamber at high temperature, said carbon precursor gas being a hydrocarbon, in particular propane or ethylene or acetylene or methane.

5. Method according to claim 1, wherein said substance is ammonia.

6. Method according to claim 1, wherein said gaseous mixture when introduced into said reaction chamber has a C/Si ratio lower than 1.5 and higher than 1.0, so as to form an active layer, and lower than 1.0 and greater than 0.5, so as to form a buffer layer.

7. Method according to claim 1, wherein the substances contained in said precursor gases are adapted to be subjected to pyrolysis catalyzed by contact with an internal surface of said reaction chamber, and wherein said pyrolysis proceeds along said reaction chamber forming Si and C and N species at least with constant N/Si ratio.

8. Method according to claim 1, wherein said substrate is kept in rotation inside said reaction chamber during deposition.

9. Method according to claim 1, which includes introducing and flowing at least one first gaseous mixture and a second gaseous mixture internally along the reaction chamber at high temperature;
wherein said first gaseous mixture and said second gaseous mixture comprise: one or more gases being precursor of silicon carbide to be deposited and a carrier gas and a precursor gas containing a substance adapted to give rise ton-type doping.

10. Method according to claim 9, wherein said first gaseous mixture and said second gaseous mixture are different from each other at least in composition.

11. Method according to claim 9, wherein the introduction flow rate and/or the introduction speed of said first gaseous mixture and the introduction flow rate and/or the introduction speed of said second gaseous mixture are different from each other.

12. Method according to claim 9, wherein said first gaseous mixture is introduced into a central zone of said reaction chamber, and wherein said second gaseous mixture is introduced into at least one lateral zone of said reaction chamber.

13. Method according to claim 1, wherein said reaction chamber is kept isolated from the external environment before, during and after deposition by using a load-lock chamber and an automatic loading and unloading system of the substrates, thus avoiding the need to purge the chamber at each deposition.

14. Epitaxial reactor comprising the rotating susceptor inside the reaction chamber for deposition of silicon carbide on substrates by means of CVD type processes at high temperature, wherein the reaction chamber further includes the walls adapted to be heated by induction which are made of silicon carbide or silicon carbide-coated graphite for performing the method according to claim 1.

15. Epitaxial reactor according to claim 14, wherein said rotating susceptor is located inside the reaction chamber in the region having the first longitudinal position and the second longitudinal position, wherein the availability respectively of Si, C and N decreases as the gaseous mixture travels from the first longitudinal position to the second longitudinal position.

16. Epitaxial reactor according to claim 15, wherein said rotating susceptor is adapted for single-substrate support.

17. Epitaxial reactor according to claim 15, comprising an assembly for introducing gasses into said reaction chamber, wherein said assembly is placed before said reaction chamber, wherein said assembly is configured so that gasses are introduced into the reaction chamber only at a first side of said reaction chamber.

18. Epitaxial reactor according to claim 17, wherein said assembly is configured so that:
a first gaseous mixture is introduced into a central zone of said reaction chamber, and
a second gaseous mixture is introduced into at least one lateral zone of said reaction chamber;
wherein said first gaseous mixture and said second gaseous mixture have a different gas composition.

19. Epitaxial reactor according to claim 18, wherein said first gaseous mixture and said second gaseous mixture comprise or consist of: one or more gases being precursor of silicon carbide, a carrier gas, and possibly a precursor gas containing a substance adapted to give rise to n-type doping.

20. Method according to claim 1, wherein said substance is acetonitrile or pyrrole or hydrazine or hydrogen cyanide or methylamine.

* * * * *